(12) United States Patent
Cornelissens et al.

(10) Patent No.: US 7,492,207 B2
(45) Date of Patent: Feb. 17, 2009

(54) TRANSISTOR SWITCH

(75) Inventors: Koen Cornelissens, Antwerp (BE);
Michel Steyaert, Leuven (BE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/636,351

(22) Filed: Dec. 8, 2006

(65) Prior Publication Data
US 2008/0136495 A1 Jun. 12, 2008

(51) Int. Cl.
*H03K 17/00* (2006.01)

(52) U.S. Cl. .................. 327/365; 327/379; 327/389; 327/391; 327/427

(58) Field of Classification Search .................. 327/365, 327/379, 389, 391, 427
See application file for complete search history.

(56) References Cited

U.S. PATENT DOCUMENTS 7,372,301 B2 * 5/2008 Fukuoka et al. ............... 326/81

OTHER PUBLICATIONS

Abo et al., "A 1.5-V, 10-bit, 14.3-MS/s CMOS Pipeline Analog-to-Digital Converter," IEEE Journal of Solid-State Circuits, vol. 34, No. 5, May 1999, pp. 599-606.

Dessouky et al., "Very Low-Voltage Digital-Audio ΔΣ Modulator with 88-dB Dynamic Range Using Local Switch Bootstrapping," IEEE Journal of Solid-State Circuits, vol. 36, No. 3, Mar. 2001, pp. 349-355.

Gupta et al., A 64-MHz Clock-Rate ΣΔ ADC With 88-dB SNDR and -105-dB IM3 Distortion at a 1.5-MHz Signal Frequency, IEEE Journal of Solid-State Circuits, vol. 37, No. 12, Dec. 2002, pp. 1653-1661.

Keskin et al, "A Low-Voltage CMOS Switch With a Novel Clock Boosting Scheme," IEEE Transactions on Circuits and Systems-II: Express Briefs, vol. 52, No. 4, Apr. 2005, pp. 185-188.

Pan et al., "A 3.3-V 12-b 50-MS/s A/D Converter in 0.6-μm CMOS with over 80-dB SFDR," IEEE Journal of Solid-State Circuits, vol. 35, No. 12, Dec. 2000, pp. 1769-1780.

Steensgaard, Jesper, "Bootstrapped Low-Voltage Analog Switches," The Technical University of Denmark, 1999 IEEE, pp. II-29-II32.

* cited by examiner

*Primary Examiner*—Long Nguyen
*Assistant Examiner*—Brandon S Cole
(74) *Attorney, Agent, or Firm*—Brinks Hofer Gilson & Lione

(57) ABSTRACT

A circuit is disclosed, including a transistor switch having a first terminal to receive an input voltage, a second terminal to output an output voltage and a gate terminal; a determination circuit, coupled to the first terminal and the second terminal of the transistor switch, to determine a lower or higher voltage between the input voltage and the output voltage; a voltage generator, coupled to the determination circuit, to generate a sum voltage or difference voltage using the lower or higher voltage; and a control circuit, coupled to the voltage generator and the gate terminal of the transistor switch, to apply the sum voltage or difference voltage to the gate terminal of the transistor switch during a first time interval.

38 Claims, 5 Drawing Sheets

TRANSISTOR SWITCH

BACKGROUND

1. Technical Field

This invention relates to transistor switches in general and more particularly to boot-strapped field effect transistor switches.

2. Background Information

Field effect transistors can be used as switches, for example when CMOS (Complementary Metal Oxide Semiconductor) technology is employed. The source and drain terminals of a field effect transistor then form the input and output terminals of a switch, while the gate terminal of the field effect transistor is a control terminal of the switch. However, field effect transistors have non-idealities which, for example, will cause the on-resistance of the switch to vary depending on the applied voltages. Furthermore transition effects may occur when the switch changes its state.

A problem with field effect transistors is the voltage dependent on-resistance. A field effect transistor used as a switch has a non-zero on-resistance $R_{on}$, which can roughly be approximated as:

$$R_{on} = \frac{1}{KP \cdot \frac{W}{L} \cdot \left(V_G - V_T - \frac{V_S + V_D}{2}\right)} \quad (1)$$

where KP is the product of the mobility $\mu$ of the charge carriers and the oxide capacitance $C_{ox}$, W and L are the width and the length of the channel region, respectively, and $V_S$, $V_D$, $V_G$ and $V_T$ are the source voltage, the drain voltage, the gate voltage and the threshold voltage, respectively. According to equation (1) the on-resistance $R_{on}$ is a function of the source voltage $V_S$, the on-resistance $R_{on}$ depends on the input voltage $V_{in}$.

Another problem with field effect transistors is the dependency of the threshold voltage $V_T$ on the bulk-source voltage $V_{BS}$. This effect can be approximated as:

$$V_T = V_{T0} \pm \gamma \cdot (\sqrt{2 \cdot |\phi_F| - V_{BS}} - \sqrt{2 \cdot |\phi_F|}) \quad (2)$$

where $\gamma$ is a technology constant which depends on the used process and $\phi_F$ is the Fermi level.

As equation (2) is a function of the source voltage $V_S$, the threshold voltage $V_T$ depends on the input voltage $V_{in}$. According to equation (1), this also influences the on-resistance $R_{on}$ of the switch.

Another non-ideality of field effect transistors is charge injection. Charge injection is a transition effect, which will distort the input and output voltages of the switch when the switch turns off. When a field effect transistor turns off, the charge that has been built up in the channel must disappear. This charge will divide between the source and drain side, depending on the total capacitance at these terminals. The effect $\Delta V$ on the source voltage $V_S$ of the switch is approximated by equation (3). Parameter A is dependent on the total capacitance of the source and drain terminals of the field effect transistor.

$$\Delta V = A \cdot \frac{C_{ox} \cdot W \cdot L \cdot (V_G - V_S - V_T)}{C_{GS} + C_{BS} + C_{sample}} \quad (3)$$

wherein $C_{ox}$, $C_{GS}$, $C_{BS}$ and $C_{sample}$ are the oxide capacity, the gate-source capacity, the bulk-source capacity and the loading capacitance of the switch when it is used in a sample-and-hold structure, respectively, and 0<A<1.

Another transition effect, which distorts the source and drain voltages of the switch when the switch turns off, is clock-feedthrough. The parasitic gate-source capacitance $C_{GS}$ of the transistor switch, together with the load capacitance at the source form a voltage divider between the clock signal and the output terminal. This results in feedthrough of the control signal driving the switch. This effect can be approximated as:

$$\Delta V = \frac{C_{GS}}{C_{GS} + C_{BS} + C_{sample}} \cdot (V_{G,off} - V_{G,on}) \quad (4)$$

where $V_{G,off}$ and $V_{G,on}$ are the gate voltages when the switch is turned off and on, respectively.

A known solution for the non-linear on-resistance $R_{on}$ (see equation (1)) of a transistor switch is bootstrapping. Bootstrapping makes the gate-source voltage $V_{GS}$ of the switch constant during the sampling phase, resulting in a signal independent on-resistance $R_{on}$. Bootstrapping is implemented, for example, by applying a constant voltage, for example a supply voltage $V_{dd}$, between the source and gate terminals when the switch is turned on.

A disadvantage of the bootstrapping technique is that the gate voltage $V_G$ is boosted to a certain value above the source voltage $V_S$, which may result in reliability problems.

BRIEF SUMMARY

The following presents a simplified summary of the present invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

According to one embodiment of the invention, a circuit includes a field effect transistor switch, a determination circuit, a voltage generator and a control circuit. The transistor switch has a first terminal to receive an input voltage, a second terminal to output an output voltage and a gate terminal. If the transistor switch is an n-type transistor, the determination circuit determines a lower voltage between the input voltage and the output voltage, and the voltage generator generates a sum voltage by adding a first predetermined voltage to the lower voltage. If the transistor switch is a p-type transistor, the determination circuit determines a higher voltage between the input voltage and the output voltage, and the voltage generator generates a difference voltage by subtracting a first predetermined voltage from the higher voltage. The control circuit applies the sum voltage or the difference voltage to the gate terminal of the transistor switch during a first time interval.

According to a further embodiment of the invention, a circuit includes a field effect transistor switch, a determination circuit and a control circuit. The transistor switch has a first terminal to receive an input voltage, a second terminal to output an output voltage and a bulk terminal. If the transistor switch is an n-type transistor, the determination circuit determines a lower voltage between the input voltage and the output voltage, and the control circuit applies the lower voltage or a sum voltage being the sum of a predetermined voltage and the lower voltage to the bulk terminal of the transistor switch during a first time interval. If the transistor switch is a p-type transistor, the determination circuit determines a higher voltage between the input voltage and the output voltage, and the control circuit applies the higher voltage or a sum voltage being the sum of a predetermined voltage and the higher voltage to the bulk terminal of the transistor switch during a first time interval.

According to a further embodiment of the invention, a circuit includes a field effect transistor switch, a voltage generator and a control circuit. The transistor switch has a first terminal to receive an input voltage, a second terminal to output an output voltage and a gate terminal. The voltage generator generates a sum voltage by adding a predetermined voltage to the input or output voltage and a difference voltage by subtracting the predetermined voltage from the input or output voltage. The control circuit applies the sum voltage to the gate terminal of the transistor switch during a first time interval and applies the difference voltage to the gate terminal of the transistor switch during a second time interval.

According to a further embodiment of the invention, an analog-to-digital converter includes one of the circuits described above.

DESCRIPTION OF THE DRAWINGS

To the accomplishment of the foregoing and related ends, the following description and annexed drawings set forth in detail certain illustrative aspects and implementations of the present invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION

Figure 1:
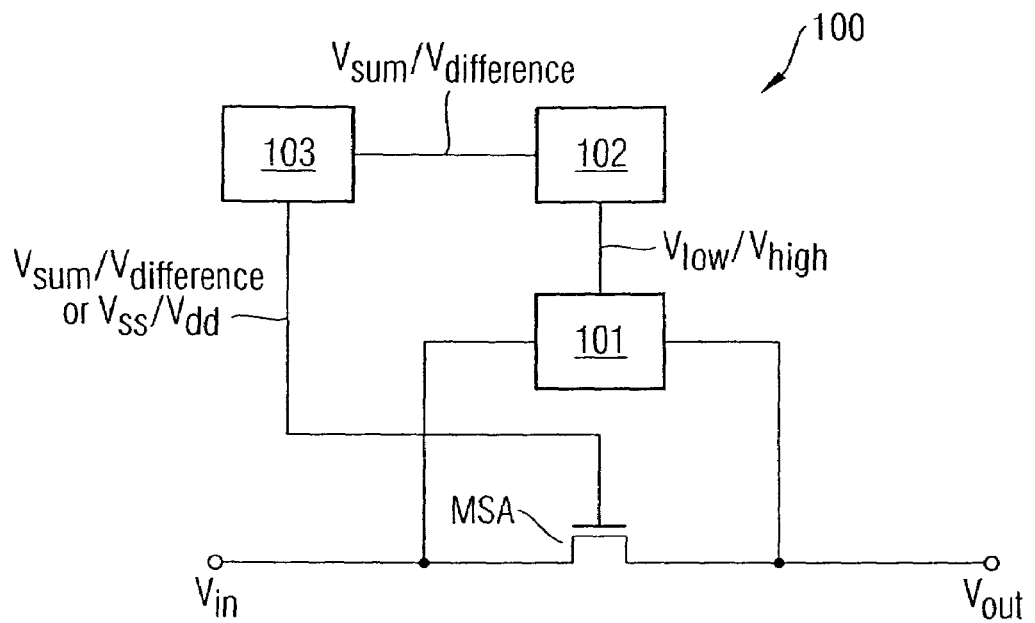
FIG. 1 schematically illustrates a first example circuit 100.

In the following embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. In other instances, known structures and devices are shown in block diagram form in order to facilitate describing one or more aspects of the embodiments of the invention. The following description is therefore not to be taken in a limiting sense, and the scope of the invention is defined by the appended claims.

Referring to FIG. 1, a block diagram of a circuit 100 is shown which serves as an exemplary embodiment of a first aspect of the invention. The circuit 100 comprises a transistor MSA, a determination circuit 101, a voltage generator 102 and a control circuit 103.

The transistor MSA functions as a field effect transistor switch and receives an input voltage $V_{in}$ at its first terminal and provides an output voltage $V_{out}$ at its second terminal when the switch is turned on, i.e. the channel of the transistor MSA is conducting. The channel of the transistor MSA may be n-doped or p-doped.

The transistor MSA may, for example, form part of a discrete time analog sampling circuit, which samples the input voltage $V_{in}$ in order to convert an analog signal into a digital value.

The determination circuit 101 has two input terminals, one of the two input terminals is connected to the first terminal of the transistor MSA and the other input terminal is connected to the second terminal of the transistor MSA. An output terminal of the determination circuit 101 is connected to an input terminal of the voltage generator 102, an output terminal of which is wired to an input terminal of the control circuit 103. An output terminal of the control circuit 103 drives the gate terminal of the transistor MSA.

If the transistor MSA is an n-type transistor, the function of the determination circuit 101 is to determine which one of the input voltage $V_{in}$ and the output voltage $V_{out}$ is lower. For example, this measurement is undertaken at the moment when the switch closes, i.e. when the transistor MSA is switched from a not conducting state to a conducting state. The lower voltage $V_{low}$ between the input voltage $V_{in}$ and the output voltage $V_{out}$ is transferred to the voltage generator 102 which adds a predetermined voltage to the lower voltage $V_{low}$. The predetermined voltage is a fixed voltage which does not vary while the transistor MSA is conducting. For example, the predetermined voltage may be a supply voltage $V_{dd}$, which provides the power supply for the circuit 100, or may be a fixed voltage derived from the supply voltage $V_{dd}$, wherein the fixed voltage is smaller than the supply voltage $V_{dd}$. The sum voltage $V_{sum}$ of the lower voltage $V_{low}$ and the predetermined voltage, i.e. for example ($V_{low}+V_{dd}$), is provided to the control circuit 103. The control circuit 103 applies the sum voltage $V_{sum}$ to the gate terminal of the transistor MSA during a first time interval. During a second time interval a ground potential $V_{ss}$ may, for example, be applied to the gate terminal of the transistor MSA.

For example, during the first time interval, the transistor MSA is in the "on" state. The sum voltage $V_{sum}$ is applied to the gate terminal and a low on-resistance is established from drain to source. When the circuit 100 is used as a part of an analog-to-digital converter, the analog input signal is sampled during the first time interval. During the second time interval the gate terminal of the transistor MSA is grounded so that the transistor MSA is in the "off" state.

If the transistor MSA is a p-type transistor, the functions of the determination circuit 101, the voltage generator 102 and the control circuit 103 slightly differ from their functions when the transistor MSA is an n-type transistor. For a p-doped transistor channel the determination circuit 101 determines which one of the input voltage $V_{in}$ and the output voltage $V_{out}$ is higher. For example, this measurement is undertaken at the moment when the switch closes, i.e. when the transistor MSA is switched from a not conducting state to a conducting state. The higher voltage $V_{high}$ between the input voltage $V_{in}$ and the output voltage $V_{out}$ is transferred to the voltage generator 102 which subtracts a predetermined voltage, for example the supply voltage $V_{dd}$, from the higher voltage $V_{high}$. The predetermined voltage is a fixed voltage which does not vary while the transistor MSA is conducting. The difference voltage $V_{difference}$ of the higher voltage $V_{high}$ and the predetermined voltage, i.e. for example ($V_{high}$-$V_{dd}$), is provided to the control circuit 103. The control circuit 103 applies the difference voltage $V_{difference}$ to the gate terminal of the transistor MSA during the first time interval. During the second time interval the supply voltage $V_{dd}$ may, for example, be applied to the gate terminal of the transistor MSA.

The gate terminal of the transistor MSA may be set at the minimum (or maximum in case of a p-type transistor MSA) of the source and drain voltages, raised (or diminished) with the predetermined fixed voltage, for example the supply voltage $V_{dd}$. This minimal (or maximal) voltage is determined at the moment the switch closes. During the time the switch is closed, the gate voltage keeps following this voltage. By choosing the minimal (or maximal) voltage side, the differences between gate and source voltage and between gate and drain voltage will not exceed the supply voltage $V_{dd}$. This may help to solve the reliability problem addressed above.

Figure 2:
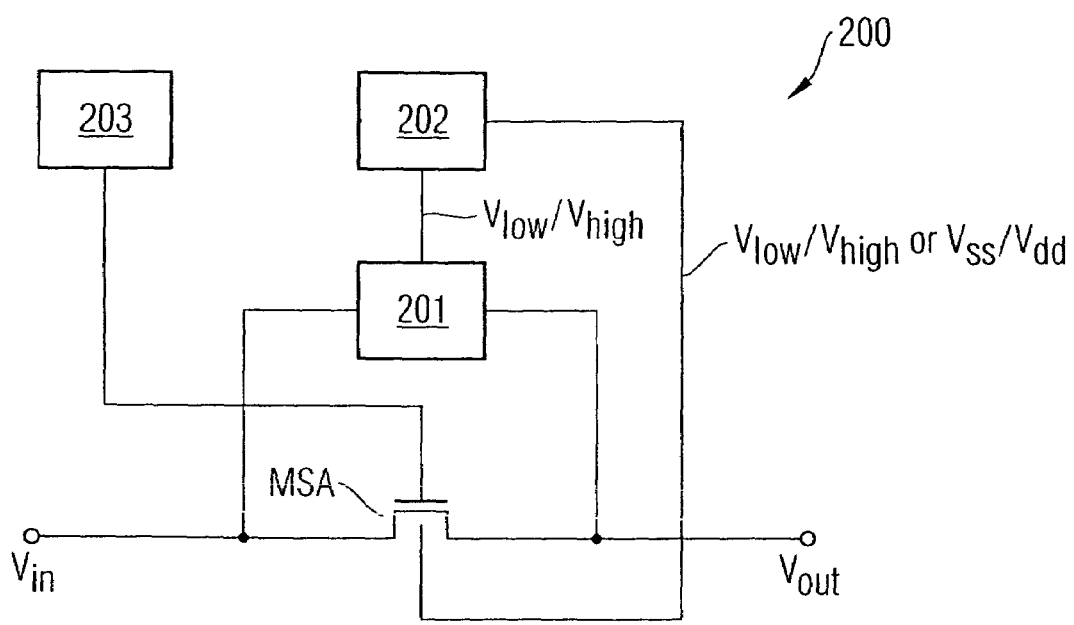
FIG. 2 schematically illustrates a second example circuit 200.

Referring to FIG. 2, a block diagram of a circuit 200. The circuit 200 comprises a transistor MSA, a determination circuit 201 and a voltage generator 202. The circuit 200 may also comprise a control circuit 203 to drive the gate terminal of the transistor 200.

As in the circuit 100, the transistor MSA functions as a field effect transistor switch and receives an input voltage $V_{in}$ at its first terminal and provides an output voltage $V_{out}$ at its second terminal when the switch is turned on, i.e. the channel of the transistor MSA is conducting. The channel of the transistor MSA may be n-doped or p-doped.

The determination circuit 201 has two input terminals, one of the two input terminals is connected to the first terminal of the transistor MSA and the other input terminal is connected to the second terminal of the transistor MSA. An output terminal of the determination circuit 201 is connected to an input terminal of the control circuit 202. An output terminal of the control circuit 202 is wired to the bulk terminal of the transistor MSA.

When the transistor MSA is an n-type transistor, the function of the determination circuit 201 is to determine which one of the input voltage $V_{in}$ and the output voltage $V_{out}$ is lower. For example, this measurement is undertaken at the moment when the switch closes, i.e. when the transistor MSA is switched from a not conducting state to a conducting state. The lower voltage $V_{low}$ between the input voltage $V_{in}$ and the output voltage $V_{out}$ is transferred to the control circuit 202 which applies the lower voltage $V_{low}$ to the bulk terminal of the transistor MSA during a first time interval. Alternatively, the control circuit 202 may add a predetermined fixed voltage to the lower voltage $V_{low}$ and may apply this sum voltage to the bulk terminal during the first time interval. During a second time interval a ground potential $V_{ss}$ may, for example, be applied to the bulk terminal of the transistor MSA. For example, during the first and second time interval the transistor MSA is in the "on" and "off" state, respectively.

When the transistor MSA is a p-type transistor, the determination circuit 201 determines which one of the input voltage $V_{in}$ and the output voltage $V_{out}$ is higher. This higher voltage $V_{high}$ or a sum voltage of a predetermined voltage and the higher voltage $V_{high}$ is applied to the bulk terminal of the transistor MSA during the first time interval. During the second time interval the supply voltage $V_{dd}$ may, for example, be applied to the bulk terminal of the transistor MSA.

The transistor MSA may comprise a triple-well transistor. A triple-well transistor comprises a first well formed in a substrate. A second well is formed in the first well. One or more third wells, which are for example source and drain, are formed in the second well.

The bulk-source voltage $V_{BS}$ may be fixed since the bulk terminal is driven with the chosen minimal (or maximal) voltage. Consequently, no variation of the threshold voltage $V_T$ can occur (see equation (2)).

Figure 3:
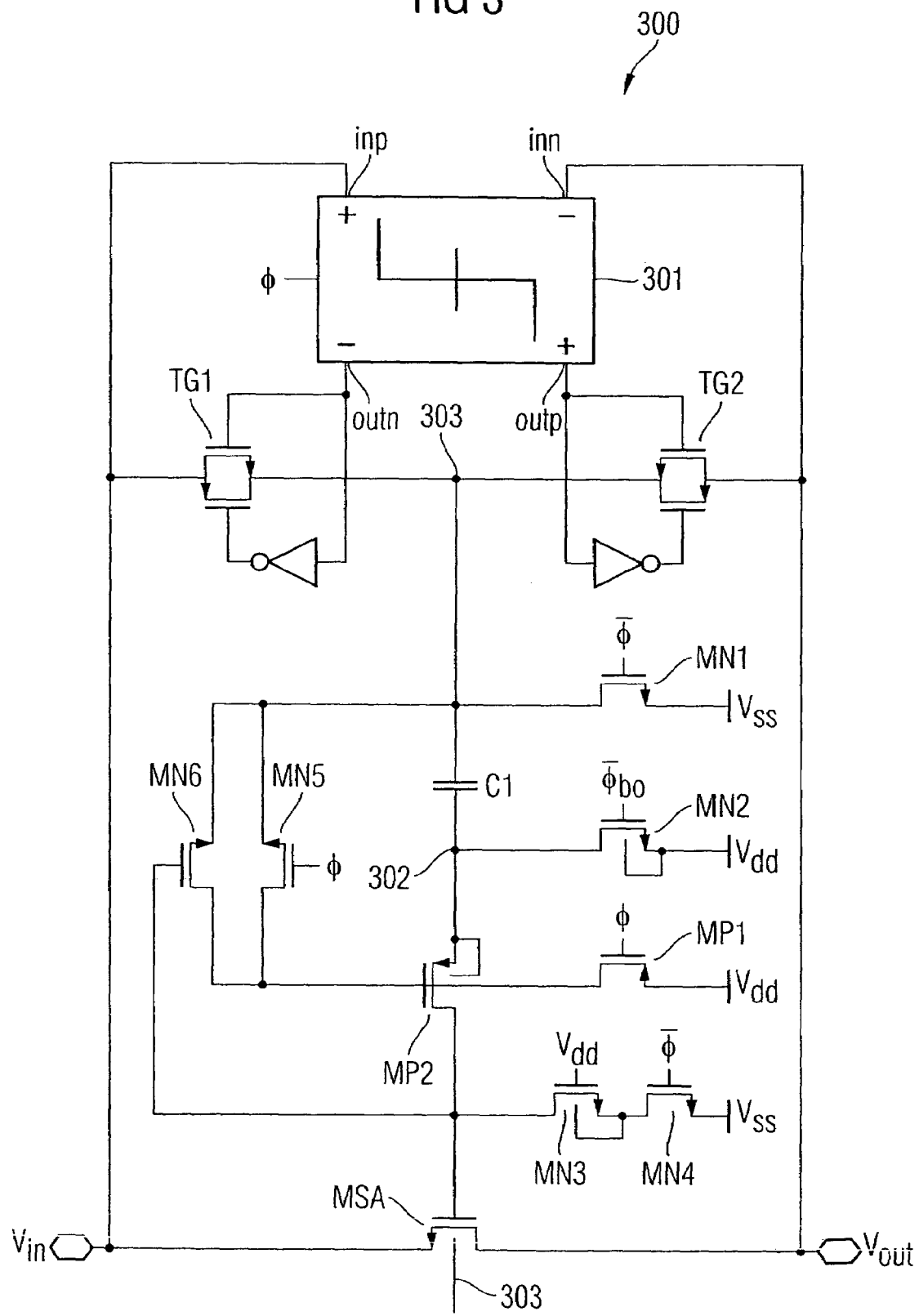
FIG. 3 schematically illustrates a third example circuit 300.

According to one embodiment of the invention, the first and second aspects of the invention, which are exemplarily explained above, can be combined. In FIG. 3 a block diagram of a circuit 300 is shown which serves as an exemplary embodiment of a combination of the first and second aspects of the invention. In the circuit 300, the channel of the field effect transistor MSA is n-doped. The determination circuit, which determines the lower voltage $V_{low}$ between the input voltage $V_{in}$ and the output voltage $V_{out}$, is denoted by 301 in FIG. 3. Furthermore, in FIG. 3 a clock signal φ and an inverted clock signal $\bar{φ}$ are shown. The clock signal φ controls the switch state of the transistor switch MSA. During the first time intervals the clock signal φ is high (the inverted clock signal $\bar{φ}$ is low) and the switch is closed meaning the source-drain path of the transistor MSA is conducting. During the second time intervals the clock signal φ is low (the inverted clock signal $\bar{φ}$ is high) and the switch is open meaning the source-drain path of the transistor MSA is not conducting.

When the clock signal φ is low, transistors MN1 and MN2 are closed, charging capacitor C1 to the supply voltage $V_{dd}$. Transistors MN3 and MN4 are also closed, thus keeping the gate terminal of the transistor MSA to the ground potential $V_{ss}$, hence the transistor MSA is not conducting and the switch is open. Transistor MP1 keeps the gate terminal of transistor MP2 at the supply voltage Vdd. Hence the transistor MP2 is not conducting and isolates a circuit node 302 from the gate terminal of the transistor MSA.

When the clock signal φ changes to a high voltage, the source-drain path of the transistor MSA becomes conductive and the switch will close. The clock signal φ also triggers the determination circuit 301 to select between the input voltage $V_{in}$ and the output voltage $V_{out}$. Because the transistor MSA may be an n-type transistor, the determination circuit 301 decides which one of the input voltage $V_{in}$ and the output voltage $V_{out}$ is lower and closes an appropriate transmission gate TG1 or TG2. This decision does not change until the clock signal φ goes low again. The transistors MN1, MN2, MP1 and MP4 are all opened by the change of the clock signal φ. As a result, a circuit node 303 changes to the lower voltage $V_{low}$ selected by the determination circuit 301. Because the capacitor C1 was charged to the supply voltage $V_{dd}$ during the second time interval, the voltage at the circuit node 302 raises to ($V_{low}$+$V_{dd}$). Transistor MN5 will lower the gate voltage of transistor MP2, closing the transistor MP2. Closing the transistor MP2 results in raising the gate of the transistor MSA to ($V_{low}$+$V_{dd}$). This will close transistor MN6, which further helps to bring the gate of the transistor MP2 to the lower voltage $V_{low}$, making a low-resistance connection between the boost capacitance C1 and the gate of the transistor MSA. As the gate of the transistor MSA is now at ($V_{low}$+$V_{dd}$), the switch is closed and the on-resistance is signal-independent as its gate-source voltage $V_{GS}$ equals the supply voltage $V_{dd}$.

In the circuit 300 the MSA transistor is a triple-well transistor, and the circuit node 303 is connected to the bulk terminal of the transistor MSA. Consequently, when the transistor MSA is conducting, its bulk voltage $V_B$ is equal to its source voltage $V_S$ (namely the lower voltage $V_{low}$). This results in a fixed bulk-source voltage $V_{BS}$ which makes the threshold voltage $V_T$ signal-independent and cancels the above mentioned body effect. During the second time intervals the circuit node 303 is set to the ground potential $V_{ss}$, so no forward biasing of the bulk diodes is possible.

The transistor MN2 is driven by a clock signal $\bar{\phi}_{bo}$, which is the inverted clock signal $\bar{\phi}$ raised with the supply voltage $V_{dd}$. This may allow design of the circuit 300 without reliability problems as no gate-source voltage $V_{GS}$ or gate-drain voltage $V_{GD}$ exceeds the nominal supply voltage $V_{dd}$.

According to equation (3) the charge injection depends on the gate-source voltage $V_{GS}$, the gate-source capacitance $C_{GS}$ and the bulk-source capacitance $C_{BS}$. As in the circuit 300, the gate-source voltage $V_{GS}$ and the bulk-source voltage $V_{BS}$ are fixed during the first time intervals when the switch is closed, the parasitic transistor capacitors are also fixed. Therefore, the voltage jump due to charge injection is independent of the input voltage $V_{in}$. This allows, for example, design of switched capacitor systems without the necessity of delayed clocks.

Figure 4:
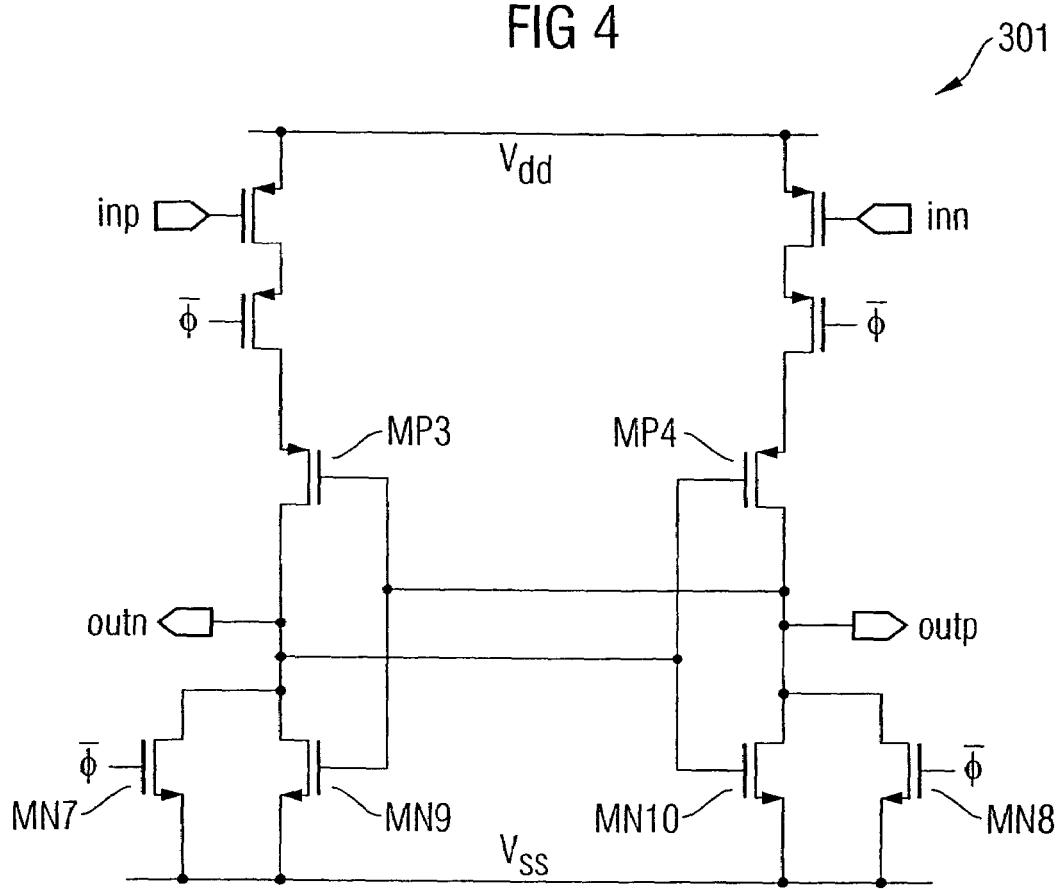
FIG. 4 schematically illustrates an exemplary implementation of a determination circuit 301.

FIG. 4 shows a possible implementation of the determination circuit 301. The determination circuit 301 shown in FIG. 4 is designed in a manner that it determines the lower voltage $V_{low}$ when the clock signal $\phi$ goes high. Furthermore, transistors MN7 and MN8 keep the output terminals outn and outp of the determination circuit 301 to the ground potential $V_{ss}$ when the inverted clock signal $\bar{\phi}$ is high. This ensures that both transmission gates TG1 and TG2 are open. Cross-coupled transistors MP3, MP4, MN9 and MN10 regenerate the voltage difference between the input terminals inp and inn of the determination circuit 301.

Figure 5:
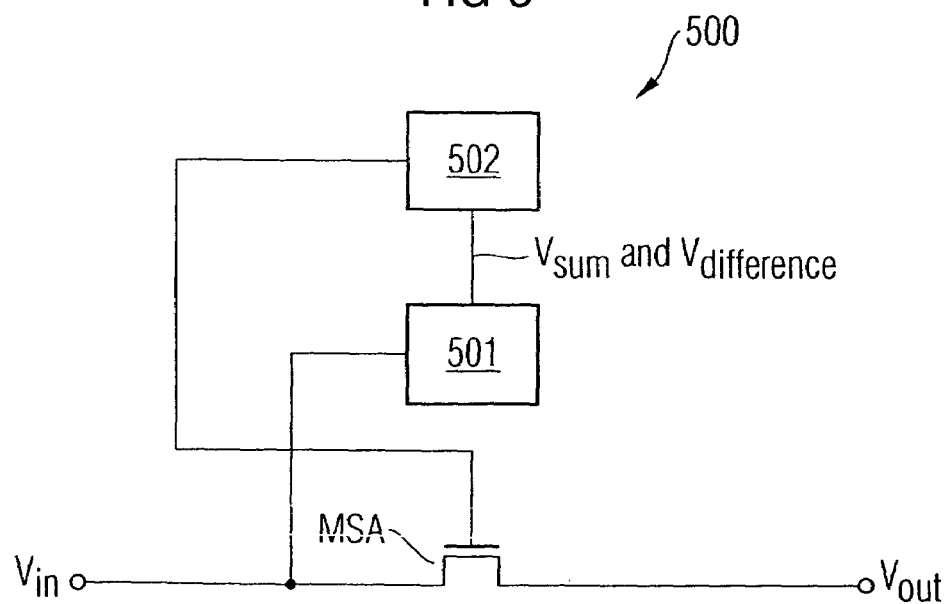
FIG. 5 schematically illustrates a fourth example circuit 500.

Referring to FIG. 5, a block diagram of a circuit 500 is shown which serves as an exemplary embodiment of a third aspect of the invention. The circuit 500 includes a transistor MSA, a voltage generator 501 and a control circuit 502.

The transistor MSA comprises a field effect transistor switch and receives an input voltage $V_{in}$ at its first terminal and provides an output voltage $V_{out}$ at its second terminal when the switch is turned on, i.e. the channel of the transistor MSA is conducting. The channel of the transistor MSA may be n-doped or p-doped.

The transistor MSA may, for example, comprise part of a discrete time analog sampling circuit, which samples the input voltage $V_{in}$ to convert an analog signal into a digital value.

The voltage generator 501 includes an input terminal, which is connected to the first terminal of the transistor MSA. An output terminal of the voltage generator 501 is wired to an input terminal of the control circuit 502. An output terminal of the control circuit 502 is connected to the gate terminal of the transistor MSA.

The voltage generator 501 generates a sum voltage by adding a predetermined voltage to the input voltage $V_{in}$ and to generate a difference voltage by subtracting the predetermined voltage from the input voltage $V_{in}$. The predetermined voltage may, for example, be the supply voltage $V_{dd}$. In this case the voltage generator 501 produces the sum voltage ($V_{in}+V_{dd}$) and the difference voltage ($V_{in}-V_{dd}$). The control circuit 502 applies the sum voltage to the gate terminal of the transistor MSA during a first time interval and applies the difference voltage to the gate terminal of the transistor MSA during a second time interval.

If the channel of the transistor MSA is n-doped, the transistor MSA is conducting during the first time interval and not conducting during the second time interval. If the channel of the transistor MSA is p-doped, the transistor MSA is not conducting during the first time interval and conducting during the second time interval.

When comparing the gate voltages of the transistor MSA during the first time interval and the second time interval, there is a difference in gate voltage that equals two times the predetermined voltage, for example $2 \cdot V_{dd}$. Because this voltage difference is independent of the input voltage $V_{in}$, equation (4) is also independent of the input voltage $V_{in}$ (since $V_{G,off}-V_{G,on}=2 \cdot V_{dd}$). Hence clock-feedthrough of circuit 500 results in a voltage jump which is independent of the input voltage $V_{in}$.

Figure 6:
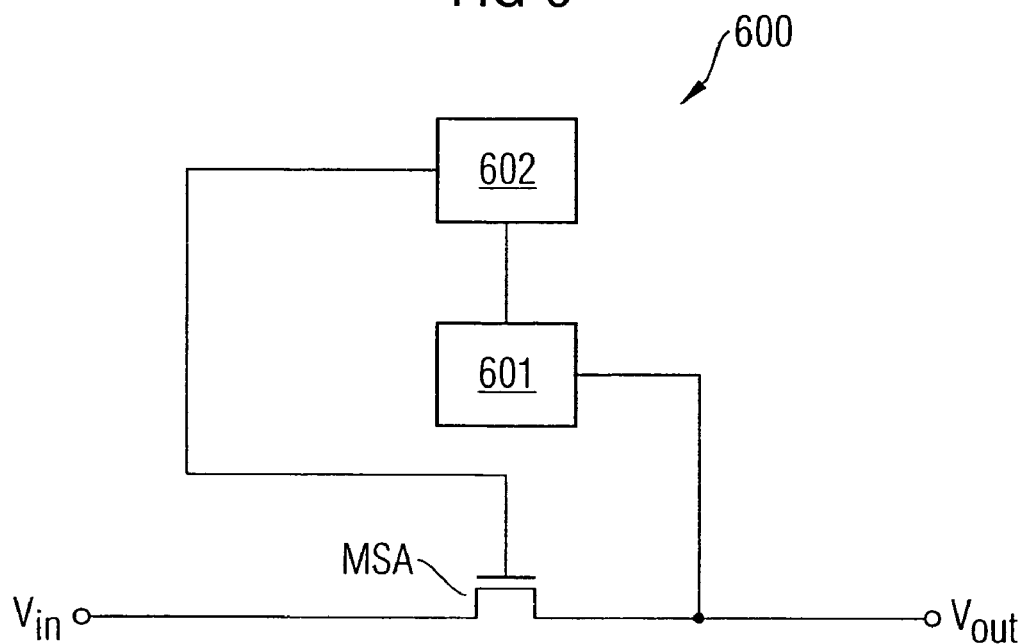
FIG. 6 schematically illustrates a fifth example circuit 600.

In FIG. 6, a block diagram of a circuit 600 is shown, which is a variation of the circuit 500 shown in FIG. 5. Instead of being connected to the input terminal of the transistor MSA, a voltage generator 601 of the circuit 600 is connected to the output terminal of the transistor MSA. The function of the voltage generator 601 is to generate a sum voltage by adding a predetermined voltage to the output voltage $V_{out}$ and to generate a difference voltage by subtracting the predetermined voltage from the output voltage $V_{out}$. The predetermined voltage may, for example, be the supply voltage $V_{dd}$. In this case the voltage generator 601 produces the sum voltage ($V_{out}+V_{dd}$) and the difference voltage ($V_{out}-V_{dd}$). A control circuit 602, which is coupled to the voltage generator 601, applies the sum voltage to the gate terminal of the transistor MSA during the first time interval and applies the difference voltage to the gate terminal of the transistor MSA during the second time interval.

Figure 7:
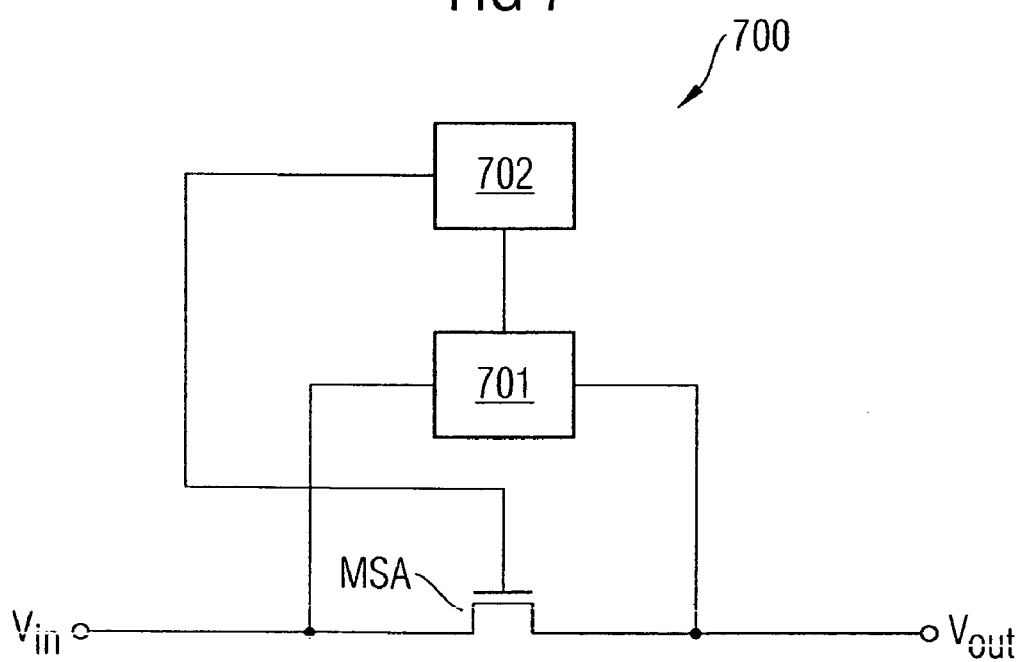
FIG. 7 schematically illustrates a sixth example circuit 700.

In FIG. 7, a block diagram of a circuit 700 is shown, which is a combination of the circuits 500 and 600. In the circuit 700 both the input terminal and the output terminal of the transistor MSA are connected to a voltage generator 701. The voltage generator 701 may generate sum voltages by adding a predetermined voltage to the input voltage $V_{in}$ or the output voltage $V_{out}$ and may generate difference voltages by subtracting the predetermined voltage from the input voltage $V_{in}$ or the output voltage $V_{out}$. A control circuit 702, which is coupled to the voltage generator 701 and the gate terminal of the transistor MSA, applies the generated sum and difference voltages to the gate of the transistor MSA during first and second time intervals. In case the predetermined voltage is the supply voltage $V_{dd}$, the following combinations are possible:

Combination 1: first time interval: $V_{in}+V_{dd}$; second time interval: $V_{in}-V_{dd}$.

Combination 2: first time interval: $V_{in}+V_{dd}$; second time interval: $V_{out}-V_{dd}$.

Combination 3: first time interval: $V_{out}+V_{dd}$; second time interval: $V_{in}-V_{dd}$.

Combination 4: first time interval: $V_{out}+V_{dd}$; second time interval: $V_{out}-V_{dd}$.

It may be provided that the control circuit 702 selects an appropriate combination among the four combinations listed above for each time interval, wherein the supply voltage $V_{dd}$ can be replaced by any predetermined voltage. As an example, the second combination may be advantageous over the first combination due to the following reasons. The gate-drain capacitance $C_{GD}$ of the transistor MSA may result in feedthrough of the gate signal to the output terminal. Thus, when using a boosted input voltage $V_{in}$ during the second time interval, the input signal will be fed through to the output voltage $V_{out}$ (diminished by a factor of $C_{GD}/(C_{GD}+C_{sample})$). This effect may disappear when a lowered version of the output voltage $V_{out}$ is used.

Figure 8:
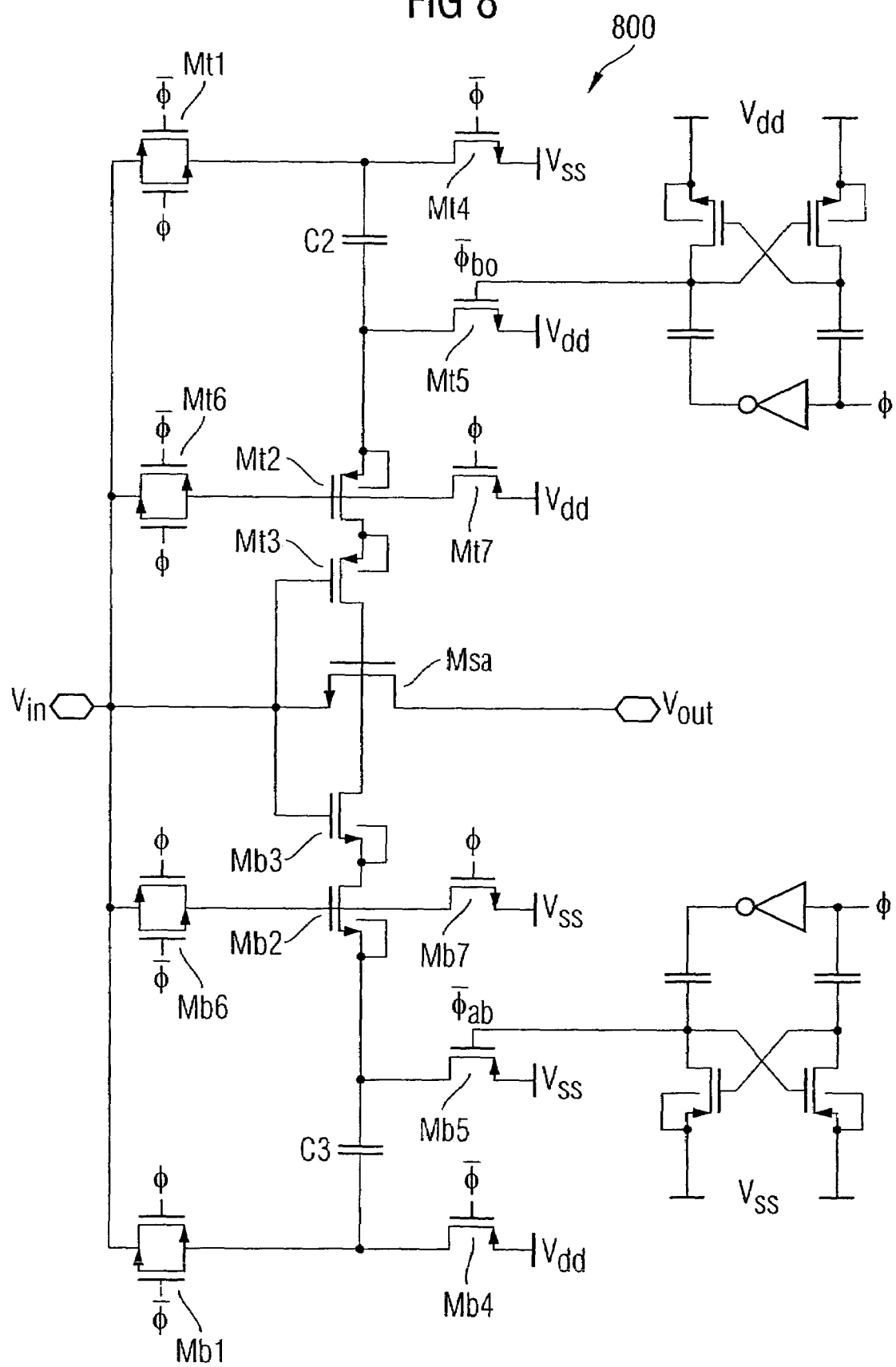
FIG. 8 schematically illustrates a seventh example circuit 800.

In FIG. 8, a block diagram of a circuit 800 is shown which serves as a further exemplary embodiment of the third aspect of the invention. In the circuit 800, the channel of the transistor MSA is n-doped. As in FIG. 3 a clock signal $\phi$ and an inverted clock signal $\bar{\phi}$ determine the state of the switch. During the first time intervals the clock signal $\phi$ is high (the inverted clock signal $\bar{\phi}$ is low) and the switch is closed meaning the source-drain path of the transistor MSA is conducting.

During the second time intervals the clock signal φ is low (the inverted clock signal φ̄ is high) and the switch is open meaning the source-drain path of the transistor MSA is not conducting.

During the second time intervals transistors Mt4 and Mt5 are closed and charge capacitor C2 to the supply voltage $V_{dd}$. Transistor Mb1 passes the input voltage $V_{in}$ to capacitor C3 charging the capacitor C3 to $-V_{dd}$. Transistor Mb6 closes transistor Mb2, lowering the drain of transistor Mb3 to ($V_{in}-V_{dd}$). As a result the transistor Mb2 closes, bringing the gate of the transistor MSA to ($V_{in}-V_{dd}$), what opens the switch.

During the first time intervals the operation is reversed. Now the capacitor C3 is recharged to $-V_{dd}$, while transistors Mt1 and Mt6 are closed, closing transistor Mt2. This brings the bottom node of the capacitor C2 to ($V_{in}+V_{dd}$). The transistor Mt2 transfers this voltage and closes transistor Mt3. This brings the gate of the transistor MSA to ($V_{in}+V_{dd}$), what closes the switch.

As a result, the difference in gate voltage of the transistor MSA during the first and second time intervals is $2 \cdot V_{dd}$ and is independent of the input voltage $V_{in}$. Therefore the effect of clock-feedthrough is independent of the input voltage $V_{in}$.

Transistors Mt3 and Mb3 are used to ensure that the gate-drain voltage $V_{GD}$ of the transistors Mt2 and Mb2 do not exceed the supply voltage $V_{dd}$.

The transistor Mt5 is driven by a clock signal $\bar{\phi}_{bo}$, which is the inverted clock signal φ̄ raised with the supply voltage $V_{dd}$. Transistor Mb5 is driven by a clock signal $\bar{\phi}_{ab}$, which is the inverted clock signal φ̄ lowered with the supply voltage $V_{dd}$.

According to one embodiment of the invention, the transistors of the circuits 100, 200, 300, 500, 600, 700 or 800 are Metal Oxide Semiconductor (MOS) transistors and are implemented in CMOS technology.

All three aspects of the invention, the exemplary embodiments of which are shown in FIGS. 1 to 8, may be combined in any manner. For example, the first and the third aspect may be combined by driving an n-type transistor MSA with the voltage ($V_{low}+V_{dd}$) during the first time intervals and the voltage ($V_{low}-V_{dd}$) during the second time intervals. In case of a p-type transistor MSA, the voltage ($V_{high}-V_{dd}$) would be applied during the first time intervals and the voltage ($V_{high}+V_{dd}$) during the second time intervals.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

The invention claim is:

1. A circuit, comprising:
   an n-type field effect transistor switch including a first terminal to receive an input voltage, a second terminal to output an output voltage, and a gate terminal;
   a determination circuit, coupled to the first terminal and the second terminal of the transistor switch, to determine a lower voltage between the input voltage and the output voltage;
   a voltage generator, coupled to the determination circuit, to generate a sum voltage by adding a first predetermined voltage to the lower voltage; and
   a control circuit, coupled to the voltage generator and the gate terminal of the transistor switch, to apply the sum voltage to the gate terminal of the transistor switch during a first time interval.

2. The circuit of claim 1, wherein the transistor switch is closed during the first time interval.

3. The circuit of claim 1, wherein the first predetermined voltage is derived from a supply voltage.

4. The circuit of claim 1, wherein a second predetermined voltage is applied to the gate terminal of the transistor switch during a second time interval.

5. The circuit of claim 4, wherein the transistor switch is open during the second time interval.

6. The circuit of claim 4, wherein the second predetermined voltage comprises a ground potential when the transistor switch includes an n-type field effect transistor and the second predetermined voltage comprises the supply voltage when the transistor switch includes a p-type field effect transistor.

7. The circuit of claim 1, further comprising a capacitor charged to the first predetermined voltage during the second time interval.

8. The circuit of claim 7, wherein the lower voltage is applied to a first terminal of the capacitor, and a second terminal of the capacitor is coupled to the gate terminal of the transistor switch during the first time interval.

9. The circuit of claim 1, wherein the transistor switch comprises a bulk terminal, and the lower voltage is applied to the bulk terminal during the first time interval.

10. A circuit, comprising:
    a p-type field effect transistor switch including a first terminal to receive an input voltage, a second terminal to output an output voltage, and a gate terminal;
    a determination circuit, coupled to the first terminal and the second terminal of the transistor switch, to determine a higher voltage between the input voltage and the output voltage;
    a voltage generator, coupled to the determination circuit, to generate a difference voltage by subtracting a first predetermined voltage from the higher voltage; and
    a control circuit, coupled to the voltage generator and the gate terminal of the transistor switch, to apply the difference voltage to the gate terminal of the transistor switch during a first time interval.

11. The circuit of claim 10, wherein the transistor switch comprises a bulk terminal, and the higher voltage is applied to the bulk terminal during the first time interval.

12. A circuit, comprising:
    an n-type field effect transistor switch including a first terminal to receive an input voltage, a second terminal to output an output voltage, and a bulk terminal;
    a determination circuit, coupled to the first terminal and the second terminal of the transistor switch, to determine a lower voltage between the input voltage and the output voltage; and a control circuit, coupled to the determination circuit and the bulk terminal of the transistor switch, to apply the lower voltage or a sum voltage being the sum of a predetermined voltage and the lower voltage to the bulk terminal of the transistor switch during a first time interval.

13. The circuit of claim 12, wherein the transistor switch is closed during the first time interval.

14. The circuit of claim 12, wherein the first predetermined voltage is derived from a supply voltage.

15. The circuit of claim 12, wherein a second predetermined voltage is applied to the bulk terminal of the transistor switch during a second time interval.

16. The circuit of claim 15, wherein the transistor switch is open during the second time interval.

17. The circuit of claim 15, wherein the second predetermined voltage comprises a ground potential when the transistor switch includes an n-type field effect transistor and the second predetermined voltage comprises the supply voltage when the transistor switch includes a p-type field effect transistor.

18. The circuit of claim 12, wherein the transistor switch comprises a triple-well transistor.

19. A circuit, comprising:
a p-type field effect transistor switch including a first terminal to receive an input voltage, a second terminal to output an output voltage, and a bulk terminal;
a determination circuit, coupled to the first terminal and the second terminal of the transistor switch, to determine a higher voltage between the input voltage and the output voltage; and
a control circuit, coupled to the determination circuit and the bulk terminal of the transistor switch, to apply the higher voltage or a sum voltage being the sum of a predetermined voltage and the higher voltage to the bulk terminal of the transistor switch during a first time interval.

20. A circuit, comprising:
a field effect transistor switch including a first terminal to receive an input voltage, a second terminal to output an output voltage, and a gate terminal;
a voltage generator, coupled to the first terminal or the second terminal of the transistor switch, to generate a sum voltage by adding a predetermined voltage to the input voltage or the output voltage and a difference voltage by subtracting the predetermined voltage from the input voltage or the output voltage; and
a control circuit, coupled to the voltage generator and the gate terminal of the transistor switch, to apply the sum voltage to the gate terminal of the transistor switch during a first time interval and to apply the difference voltage to the gate terminal of the transistor switch during a second time interval.

21. The circuit of claim 20, wherein the transistor switch is closed during the first time interval and open during the second time interval when the transistor switch comprises an n-type transistor switch.

22. The circuit of claim 20, wherein the transistor switch is open during the first time interval and closed during the second time interval when the transistor switch comprises a p-type transistor switch.

23. The circuit of claim 20, wherein the predetermined voltage is derived from a supply voltage.

24. The circuit of claim 20, further comprising a first capacitor charged to the predetermined voltage during the second time interval.

25. The circuit of claim 24, wherein the input voltage or the output voltage is applied to a first terminal of the first capacitor, and a second terminal of the first capacitor is coupled to the gate terminal of the transistor switch during the first time interval.

26. The circuit of claim 20, further comprising a second capacitor charged to the negative predetermined voltage during the first time interval.

27. The circuit of claim 26, wherein the input voltage or the output voltage is applied to a first terminal of the second capacitor, and a second terminal of the second capacitor is coupled to the gate terminal of the transistor switch during the second time interval.

28. An analog-to-digital converter, comprising a circuit including:
an n-type field effect transistor switch including a first terminal to receive an input voltage, a second terminal to output an output voltage, and a gate terminal;
a determination circuit, coupled to the first terminal and the second terminal of the transistor switch, to determine a lower voltage between the input voltage and the output voltage;
a voltage generator, coupled to the determination circuit, to generate a sum voltage by adding a first predetermined voltage to the lower voltage; and
a control circuit, coupled to the voltage generator and the gate terminal of the transistor switch, to apply the sum voltage to the gate terminal of the transistor switch during a first time interval.

29. A method, comprising:
providing an n-type field effect transistor switch including a first terminal, a second terminal, and a gate terminal, wherein an input voltage is applied to the first terminal and an output voltage is output at the output voltage;
determining a lower voltage between the input voltage and the output voltage;
generating a sum voltage by adding a first predetermined voltage to the lower voltage; and
applying the sum voltage to the gate terminal of the transistor switch during a first time interval.

30. A method, comprising:
providing a p-type field effect transistor switch including a first terminal, a second terminal, and a gate terminal, wherein an input voltage is applied to the first terminal and an output voltage is output at the output voltage;
determining a higher voltage between the input voltage and the output voltage;
generating a difference voltage by subtracting a first predetermined voltage from the higher voltage; and
applying the difference voltage to the gate terminal of the transistor switch during a first time interval.

31. A method, comprising:
providing an n-type field effect transistor switch including a first terminal, a second terminal, and a bulk terminal, wherein an input voltage is applied to the first terminal and an output voltage is output at the output voltage;
determining a lower voltage between the input voltage and the output voltage; and
applying the lower voltage or a sum voltage being the sum of a predetermined voltage and the lower voltage to the bulk terminal of the transistor switch during a first time interval.

32. A method, comprising:
providing a p-type field effect transistor switch including a first terminal, a second terminal, and a bulk terminal, wherein an input voltage is applied to the first terminal and an output voltage is output at the output voltage;

determining a higher voltage between the input voltage and the output voltage; and applying the higher voltage or a sum voltage being the sum of a predetermined voltage and the higher voltage to the bulk terminal of the transistor switch during a first time interval.

33. A method, comprising:

providing a field effect transistor switch including a first terminal, a second terminal, and a gate terminal, wherein an input voltage is applied to the first terminal and an output voltage is output at the output voltage;

generating a sum voltage by adding a predetermined voltage to the input or output voltage and generating a difference voltage by subtracting the predetermined voltage from the input or output voltage; and applying the sum voltage to the gate terminal of the transistor switch during a first time interval and applying the difference voltage to the gate terminal of the transistor switch during a second time interval.

34. An apparatus, comprising:

an n-type field effect transistor switch including a first terminal, a second terminal, and a gate terminal, wherein an input voltage is applied to the first terminal and an output voltage is output at the output voltage, the apparatus;

means for determining a lower voltage between the input voltage and the output voltage;

means for generating a sum voltage by adding a first predetermined voltage to the lower voltage; and means for applying the sum voltage to the gate terminal of the transistor switch during a first time interval.

35. An apparatus, comprising:

a p-type field effect transistor switch including a first terminal, a second terminal, and a gate terminal, wherein an input voltage is applied to the first terminal and an output voltage is output at the output voltage;

means for determining a higher voltage between the input voltage and the output voltage;

means for generating a difference voltage by subtracting a first predetermined voltage from the higher voltage; and means for applying the difference voltage to the gate terminal of the transistor switch during a first time interval.

36. An apparatus, comprising:

an n-type field effect transistor switch including a first terminal, a second terminal, and a bulk terminal, wherein an input voltage is applied to the first terminal and an output voltage is output at the output voltage;

means for determining a lower voltage between the input voltage and the output voltage; and means for applying the lower voltage or a sum voltage being the sum of a predetermined voltage and the lower voltage to the bulk terminal of the transistor switch during a first time interval.

37. An apparatus, comprising:

a p-type field effect transistor switch including a first terminal, a second terminal, and a bulk terminal, wherein an input voltage is applied to the first terminal and an output voltage is output at the output voltage;

means for determining a higher voltage between the input voltage and the output voltage; and means for applying the higher voltage or a sum voltage being the sum of a predetermined voltage and the higher voltage to the bulk terminal of the transistor switch during a first time interval.

38. An apparatus, comprising:

a field effect transistor switch including a first terminal, a second terminal, and a gate terminal, wherein an input voltage is applied to the first terminal and an output voltage is output at the output voltage;

means for generating a sum voltage by adding a predetermined voltage to the input or output voltage and generating a difference voltage by subtracting the predetermined voltage from the input or output voltage; and means for applying the sum voltage to the gate terminal of the transistor switch during a first time interval and applying the difference voltage to the gate terminal of the transistor switch during a second time interval.

* * * * *